United States Patent
Di et al.

(10) Patent No.: US 11,560,315 B2
(45) Date of Patent: Jan. 24, 2023

(54) GRAPHENE STRUCTURE HAVING GRAPHENE BUBBLES AND PREPARATION METHOD FOR THE SAME

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Zengfeng Di, Shanghai (CN); Pengfei Jia, Shanghai (CN); Zhongying Xue, Shanghai (CN); Xiaohu Zheng, Shanghai (CN); Miao Zhang, Shanghai (CN); Xi Wang, Shanghai (CN)

(73) Assignee: Shanghai Institute of Microsystem and Information Technology, Chinese Academy of Science, Shanghai, China, Shanghai (CN)

(*) Notice: Subject to any disclaimer, the term of this patent is extended or adjusted under 35 U.S.C. 154(b) by 363 days.

(21) Appl. No.: 16/619,452

(22) PCT Filed: Apr. 10, 2018

(86) PCT No.: PCT/CN2018/082546
§ 371 (c)(1),
(2) Date: Dec. 4, 2019

(87) PCT Pub. No.: WO2019/144506
PCT Pub. Date: Aug. 1, 2019

(65) Prior Publication Data
US 2020/0346932 A1    Nov. 5, 2020

(30) Foreign Application Priority Data
Jan. 23, 2018 (CN) .......................... 201810062548.7

(51) Int. Cl.
*B32B 9/00* (2006.01)
*C01B 32/194* (2017.01)
(Continued)

(52) U.S. Cl.
CPC ........... *C01B 32/194* (2017.08); *B01J 19/088* (2013.01); *C01B 32/186* (2017.08); *C23C 16/26* (2013.01);
(Continued)

(58) Field of Classification Search
CPC ........ Y10T 428/30; B32B 9/007; B82Y 30/00
(Continued)

(56) References Cited

U.S. PATENT DOCUMENTS

2014/0165545 A1   6/2014   Pinkerton et al.
2015/0125399 A1   5/2015   Char et al.
2015/0171375 A1*   6/2015   Setz ............... H01L 51/5237
                                                 257/40

FOREIGN PATENT DOCUMENTS

CN    102719877 A    10/2012
CN    103224231 A    7/2013
(Continued)

*Primary Examiner* — Daniel H Miller
(74) *Attorney, Agent, or Firm* — Global IP Services; Tianhua Gu

(57) ABSTRACT

The present invention provides a graphene structure having graphene bubbles and a preparation method for the same. The preparation method comprises: providing a substrate; forming a hydrogen terminated layer on a top surface of the substrate and a graphene layer disposed on a top surface of the hydrogen terminated layer; and placing a probe on the graphene layer and applying a preset voltage to the probe, to excite a part of the hydrogen terminated layer at a position corresponding to the probe to convert into hydrogen, the hydrogen causing the graphene layer at a position corre-
(Continued)

sponding to the hydrogen to bulge, so as to form a graphene bubble enveloping the hydrogen.

16 Claims, 2 Drawing Sheets

(51) Int. Cl.
    *C01B 32/186*     (2017.01)
    *B01J 19/08*     (2006.01)
    *C23C 16/26*     (2006.01)
    *B82Y 30/00*     (2011.01)

(52) U.S. Cl.
    CPC .................. *B01J 2219/0805* (2013.01); *B01J 2219/0879* (2013.01); *B82Y 30/00* (2013.01); *C01B 2204/02* (2013.01); *C01B 2204/04* (2013.01); *Y10T 428/30* (2015.01)

(58) Field of Classification Search
    USPC ........................................................ 428/408
    See application file for complete search history.

(56) References Cited

FOREIGN PATENT DOCUMENTS

| | | | |
|---|---|---|---|
| CN | 106985213 A | 7/2017 | |
| CN | 107434248 A | 12/2017 | |

\* cited by examiner

GRAPHENE STRUCTURE HAVING GRAPHENE BUBBLES AND PREPARATION METHOD FOR THE SAME

CROSS REFERENCE TO RELATED PATENT APPLICATION

The present application is the US national stage of PCT/CN2018/082546 filed on Apr. 10, 2018, which claims the priority of the Chinese patent application No. 201810062548.7 filed on Jan. 23, 2018, which applications are incorporated herein by reference.

BACKGROUND OF THE PRESENT INVENTION

Field of Invention

The present invention relates to the technical field of graphene, and in particular, to a graphene structure having graphene bubbles and a preparation method for same.

Description of Related Arts

As a special graphene strain structure filled with gas, graphene bubbles can be used for effectively adjusting the Dirac point and energy band structure of graphene. Research related to graphene bubbles has been raised in recent years.

At present, it is theoretically predicted that under stress in a particular direction, graphene can generate a pseudo-magnetic field with a strength of several Tesla. With such a strong pseudo-magnetic field, a Landau level splitting phenomenon can be observed without adding an external magnetic field, and an energy band structure of the graphene can be modulated. Next, on Pt (111), naturally formed graphene nano bubbles are observed at the boundary of a graphene region grown by means of chemical vapor deposition (CVD). It is found through an STS test that a series of Landau level peaks appear on the bubbles, and a pseudo-magnetic field with a strength as high as 300 T uniformly distributed in the bubbles is obtained through fitting. The theory about producing a pseudo-magnetic field by stressed graphene is experimentally proved for the first time. In addition, a graphene bubble can be used as a nano lens in optics, and can be used as a valley filter and a beam splitter in valley electronics.

The mainly methods for preparing graphene bubbles at present are as following: 1) forming bubbles by naturally encapsulating gas in a graphene growth process based on CVD; 2) forming bubbles by gas ion injection and annealing; and 3) producing bubbles by ionizing water molecules with an electrochemical method. However, the above methods have many problems. For example, positions of bubbles cannot be controlled precisely, and it is difficult to control the sizes and shapes of the bubbles.

Therefore, it is necessary to provide a graphene structure having graphene bubbles and a preparation method for same to resolve the foregoing problems in the prior art.

SUMMARY OF THE PRESENT INVENTION

In view of the foregoing disadvantages in the prior art, an object of the present invention is to provide a graphene structure having graphene bubbles and a preparation method for same, to resolve the problems such as difficulty in controlling sizes, positions, shapes and the like in a graphene bubble preparation process in the prior art.

To accomplish the above and other related objects, the present invention provides a preparation method for a graphene structure having graphene bubbles, comprising the following steps:
1) providing a substrate;
2) forming a hydrogen terminated layer on a top surface of the substrate and a graphene layer disposed on a top surface of the hydrogen terminated layer; and
3) placing a probe on the graphene layer and applying a preset voltage to the probe, to excite a part of the hydrogen terminated layer at a position corresponding to the probe to convert into hydrogen, the hydrogen causing the graphene layer at a position corresponding to the hydrogen to bulge, so as to form a graphene bubble enveloping the hydrogen.

In a preferred solution of the present invention, in step 2), the graphene layer is formed by chemical vapor deposition (CVD), a carrier gas used in the CVD comprises hydrogen, and in the chemical vapor process, the hydrogen saturates unsaturated bonds on the top surface of the substrate to form the hydrogen terminated layer.

In a preferred solution of the present invention, in step 2), the graphene layer comprises single-layer graphene or multi-layer graphene.

In a preferred solution of the present invention, in step 1), a material of the substrate comprises any one of a group consisting of Ge, Cu, Ni, h-BN and Au.

In a preferred solution of the present invention, in step 3), a shape of bottom surface of the graphene bubble comprises any one of a dot, a linear, a circular, a square, and an annular.

In a preferred solution of the present invention, in step 3), the probe comprises an atomic force microscope (AFM) electrified probe of an AFM, and according to a position at which the graphene bubble needs to be formed, a placement position of the AFM electrified probe on the graphene layer is selected by using the AFM.

In a preferred solution of the present invention, the placement position of the AFM electrified probe on the graphene layer is selected in a contact mode of the AFM, and the preset voltage is applied to the AFM electrified probe in the contact mode.

In a preferred solution of the present invention, the AFM is set to an automatic mode, to continuously prepare a plurality of graphene bubbles.

In a preferred solution of the present invention, in step 3), the probe comprises a scanning tunneling microscope (STM) electrified probe of an STM, and according to a position at which the graphene bubble needs to be formed, a placement position of the STM electrified probe on the graphene layer is selected by using the STM.

In a preferred solution of the present invention, the placement position of the STM electrified probe on the graphene layer is selected in a constant-current mode or a constant-height mode of the STM, and the preset voltage is applied to the STM electrified probe in a pulse mode.

In a preferred solution of the present invention, in step 3), the preset voltage ranges from −12 V and −2 V.

In a preferred solution of the present invention, in step 3), a pressure between the probe and the graphene layer ranges from 0 nN and 300 nN.

In a preferred solution of the present invention, the preparation method for a graphene structure having graphene bubbles further comprises step 4): repeating step 3) at least once to form a plurality of graphene bubbles arranged with spacing.

In a preferred solution of the present invention, in step 3), the preset voltage is set according to a size of the graphene bubble that needs to be formed; and a movement area of the probe on the graphene layer is set according to the bottom surface shape of the graphene bubble that needs to be formed.

The present invention further provides a graphene structure having graphene bubbles, comprising:

a substrate;

a hydrogen terminated layer, disposed on a top surface of the substrate; and a graphene layer, disposed on a top surface of the hydrogen terminated layer, where at least one graphene bubble formed by a bulged part of the graphene layer is formed on the graphene layer, and the graphene bubble envelopes hydrogen that is converted from the hydrogen terminated layer under excitation of a preset voltage.

In a preferred solution of the present invention, shape of the bottom surface of the graphene bubble comprises any one of a dot, a linear, a circular, a square and an annular.

As described above, the graphene structure having graphene bubbles and the preparation method for same according to the present invention have the following beneficial effects:

The present invention provides a graphene structure having graphene bubbles and a preparation method for same. In the technical solution of the present invention, forming positions of graphene bubbles can be controlled precisely, and the sizes, the shapes, and the like of the graphene bubbles are highly controllable. The preparation method according to the present invention involves simple operations, is highly operable, and has high practical value.

DESCRIPTIONS OF REFERENCE NUMERALS

100 Substrate
101 Hydrogen terminated layer
102 Graphene layer
103 Probe
104 Graphene bubble
105 Hydrogen bubble
S1 to S3 Step 1) to step 43)

DETAILED DESCRIPTION OF THE PREFERRED EMBODIMENTS

Implementations of the present invention are illustrated below through specific examples. Persons skilled in the art can easily understand other advantages and efficacy of the present invention according to the content disclosed in this specification. The present invention can also be implemented or applied through other different specific implementations. Various modifications or variations can also be made on details in this specification based on different opinions and applications without departing from the spirit of the present invention.

Refer to FIGS. 1 to 5. It should be noted that, the figures provided in this embodiment merely illustrate the basic conception of the present invention schematically. Therefore, the figures only show components related to the present invention, and are not drawn according to the quantity, shapes and sizes of components during actual implementation. The pattern, quantity and ratio of components during actual implementation can be changed arbitrarily, and the component layout may also be more complex.

As shown in FIGS. 1 to 5, the present invention provides a preparation method for a graphene structure having graphene bubbles, comprising the following steps:

1) providing a substrate;
2) forming a hydrogen terminated layer on a top surface of the substrate and a graphene layer disposed on a top surface of the hydrogen terminated layer; and
3) placing a probe on the graphene layer and applying a preset voltage to the probe, to excite a part of the hydrogen terminated layer at a position corresponding to the probe to convert into hydrogen, the hydrogen causing the graphene layer at a position corresponding to the hydrogen to bulge, so as to form a graphene bubble enveloping the hydrogen.

The preparation method for a graphene structure having graphene bubbles according to the present invention is described in detail with reference to the drawings.

Figure 1:
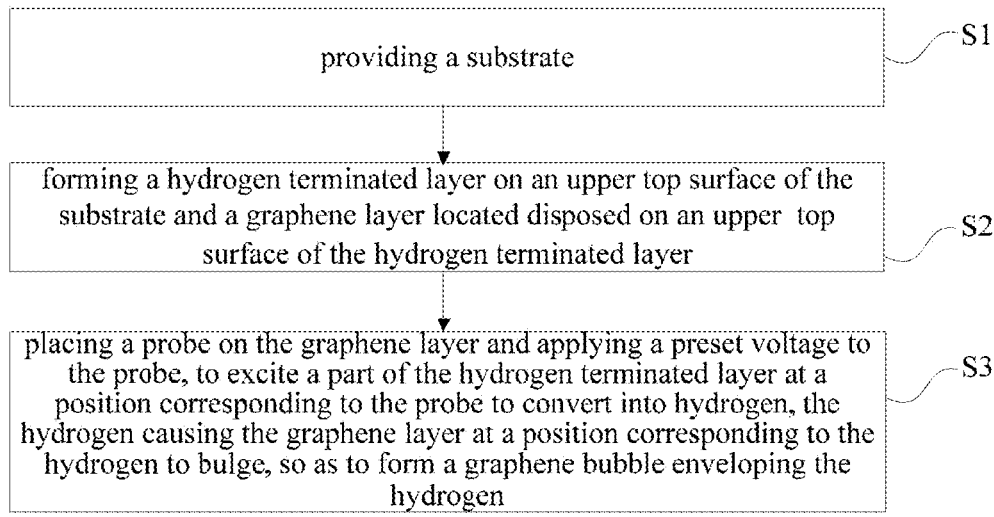
FIG. 1 is a flowchart of preparation of a graphene structure having graphene bubbles according to the present invention.
Figure 2:
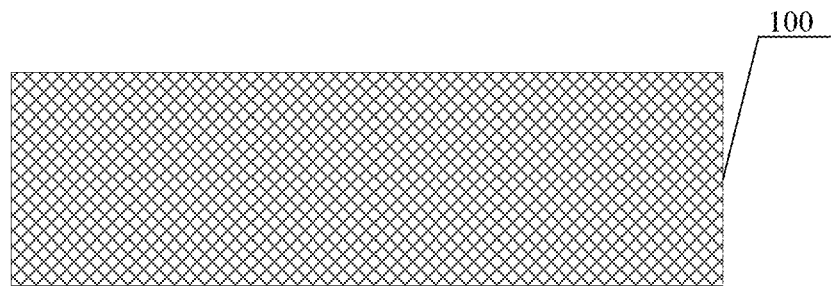
FIG. 2 is a structural diagram of providing a substrate during preparation of a graphene structure according to the present invention.

First, as shown in S1 in FIG. 1, and FIG. 2, step 1) is performed to provide a substrate 100.

As an example, in step 1), the material of the substrate 100 includes any one of a group consisting of Ge, Cu, Ni, h-BN and Au.

Specifically, a substrate 100 is provided in this step, so as to provide a structural foundation for the hydrogen terminated layer 101 and the graphene layer 102 formed subsequently. The material of the substrate 100 may be any one of Ge (germanium), Cu (copper), Ni (nickel), h-BN (hexagonal boron nitride) and Au (gold). Alternatively, the substrate 100 may be of a laminated structure formed by material layers made of at least two of the foregoing materials. Alternatively, the substrate 100 may be made of any material that is well known to persons of ordinary skill in the art and can implement the function of this solution.

Figure 3:
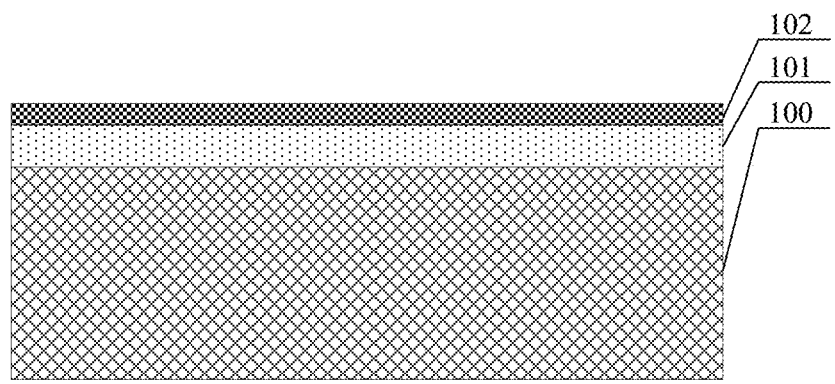
FIG. 3 is a structural diagram of forming a hydrogen terminated layer and a graphene layer during preparation of a graphene structure according to the present invention.

Next, as shown in S2 in FIG. 1, and FIG. 3, step 2) is performed to form a hydrogen terminated layer 101 on the top surface of the substrate 100 and form a graphene layer 102 disposed on the top surface of the hydrogen terminated layer 101.

Specifically, the hydrogen terminated layer 101 formed in this step provides a gas source for forming the graphene bubble 104 subsequently. In this example, the hydrogen terminated layer 101 (also referred to as a hydrogen terminated surface) is preferably a surface formed by filling unsaturated bonds on the surface of an original sample (the surface of the substrate 100) with hydrogen atoms. The hydrogen terminated layer can be approximately regarded as a layer of single-atom thin film similar to graphene, or a structure similar to two-dimensional electron gas. Alternatively, the hydrogen terminated layer may be a structural layer, such as a hydrogen ion layer, disposed on the surface of the substrate 100, as long as the hydrogen terminated layer can provide a gas source for forming hydrogen subsequently.

For example, in step 2), the graphene layer 102 is formed by means of CVD, where a carrier gas in the CVD may be hydrogen, and in the chemical vapor process, the hydrogen saturates unsaturated bonds on the top surface of the substrate 100 to form the hydrogen terminated layer 101.

As an example, in step 2), the graphene layer 102 includes single-layer graphene or multi-layer graphene.

Specifically, in this example, the hydrogen terminated layer 101 and the graphene layer 102 are formed at the same time. Preferably, the hydrogen terminated layer 101 is formed during the process of forming the graphene layer 102 by means of CVD. The graphene layer 102 is grown on the surface of the substrate 100 by means of CVD, and growth conditions are different for different substrates 100. If the purpose is to grow the graphene layer over the entire substrate, using a Ge (110) substrate as an example, growth conditions are preferably as follows: the growth temperature is 916° C., the carbon source is $CH_4$ (0.7 sccm), the carrier gas is a mixture of $H_2$ (22 sccm) and Ar (220 sccm), and the growth period is 300 min. In addition, the graphene layer may be single-layer graphene or multi-layer graphene. Both the single-layer graphene and the multi-layer graphene can be used to obtain a suitable graphene bubble according to the technical solution of the present invention. Based on the foregoing solution, a by-product layer, that is, the hydrogen terminated layer, formed in the CVD growth process of the graphene layer is utilized creatively as a gas source for forming the graphene bubble in the present invention, and no extra operation is needed. The process is simple, the operation is convenient, and the cost is low.

Figure 4:
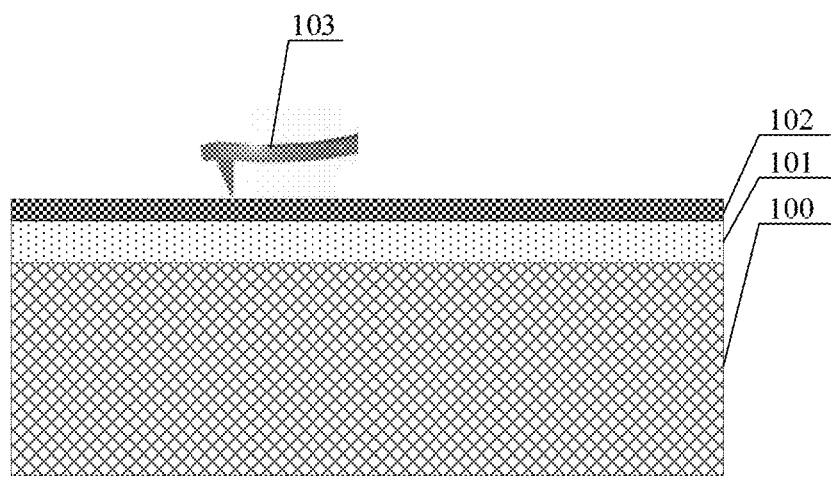
FIG. 4 is a structural diagram of placing a probe on a graphene layer during preparation of a graphene structure according to the present invention.
Figure 5:
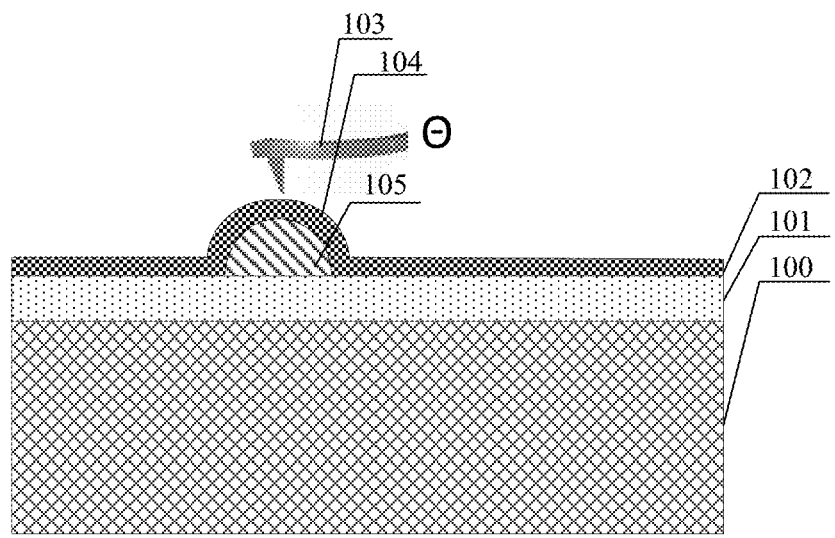
FIG. 5 is a structural diagram of forming a graphene bubble during preparation of a graphene structure according to the present invention.

Finally, as shown in S3 in FIG. 1, and FIGS. 4 to 5, step 3) is performed to place a probe 103 on the graphene layer 102 and apply a preset voltage to the probe 103, to excite a part of the hydrogen terminated layer 101 at a position corresponding to the probe 103 to convert into hydrogen, the hydrogen causes the graphene layer 102 at a position corresponding to the hydrogen to bulge, so as to form a graphene bubble 104 enveloping the hydrogen.

As an example, the preset voltage ranges from −12 V to −2 V

As an example, the pressure between the probe 103 and the graphene layer 102 ranges from 0 nN to 300 nN.

Specifically, the probe 103 is placed at a position on the graphene layer 102 where a graphene bubble needs to be formed. Preferably, the probe 103 is in contact with the top surface of the graphene layer 102. After the probe 103 selects a preset position, a preset voltage is applied to the probe 103. Under excitation of the preset voltage, an excited part of the hydrogen terminated layer is converted into hydrogen. For example, hydrogen ions in the hydrogen terminated layer 101 receive electrons under the preset voltage and are converted into hydrogen. Hydrogen bonds are broken, and the hydrogen is separated from the surface of the substrate. The hydrogen causes a part of the graphene layer which is above the hydrogen to bulge, thus forming a graphene bubble. As shown in FIG. 5, a forming position of a graphene bubble is highly controllable in the present invention. The position of the probe determines the forming position of the graphene bubble, so that the graphene bubble can be prepared at any position of the graphene layer.

The preset voltage ranges from −12 V to −2 V. The greater the absolute value of the preset voltage is, the larger the formed graphene bubble is. The absolute value of the preset voltage is controlled to be greater than 2 V, so as to better break the hydrogen bonds and reach a threshold for hydrogen bond breakage. The absolute value of the preset voltage is controlled to be less than 12 V, so as to effectively prevent a hydrogen bubble 105 from becoming excessively large, which will eventually cause the graphene bubble to break. Preferably, the preset voltage ranges from −10V and −4V, and in this example, the preset voltage is −5 V, so that a graphene bubble with good quality can be obtained.

In addition, it should be noted that, the applied period of the preset voltage does not affect the size of the graphene bubble. Therefore, the time required for forming the graphene bubble can be reduced while other conditions are met, so as to improve working efficiency.

Preferably, when the probe 103 is in contact with the graphene layer 102, a pressure therebetween is less than 200 nN, thereby ensuring that the surface of the graphene layer is well protected while the hydrogen terminated layer is converted into hydrogen under excitation.

For example, in step 3), the shape of the bottom surface of the graphene bubble 104 includes any one of a dot, a linear, a circular e, a square, and an annular.

Specifically, the bottom surface shape of the graphene bubble prepared by using the method according to the present invention can be controlled effectively, and is determined according to a movement area of the probe 103. For example, the shape of the bottom surface of the graphene bubble may be a dot. That is, the probe does not move after placement, and excites the hydrogen terminated layer at a particular point to form a single bubble. When the electrified probe sweeps over a line, a graphene bubble with a linear bottom surface shape can be formed. Likewise, when the electrified probe sweeps over an area of a particular shape, a graphene bubble of the particular shape can be obtained. For example, when the electrified probe sweeps over a rectangular area, a graphene bubble with a rectangular bottom surface shape can be formed.

For example, in step 3), the probe 103 includes an AFM electrified probe of an atomic force microscope (AFM), and according to a position at which the graphene bubble needs to be formed, a placement position of the AFM electrified probe is selected by using the AFM.

For example, the AFM selects the placement position of the AFM electrified probe in a contact mode, and the preset voltage is applied to the AFM electrified probe in the same mode after the placement position is obtained.

For example, the AFM is set to an automatic mode, so as to continuously prepare a plurality of graphene bubbles 104.

Specifically, this example provides a method for selecting a position where the graphene bubble needs to be formed and for applying the preset voltage. Under the AFM, a suitable position for forming the graphene bubble is looked for, and after the suitable position is found, the preset voltage is directly applied to the probe of the AFM, that is, the AFM electrified probe, to excite the hydrogen terminated layer, thereby finally forming the graphene bubble. The process of looking for a suitable position by using the AFM and the process of applying the preset voltage are both performed in a contact mode preferably. The two processes do not require mode switching, the operation is flexible, convenient, and highly applicable.

In addition, the AFM can be set to an automatic mode according to actual requirements, so that a large quantity of graphene bubbles can be produced continuously and rapidly in this mode.

For example, in step 3), the probe comprises an STM electrified probe of a scanning tunnel microscope, and according to a position at which the graphene bubble needs to be formed, a placement position of the STM electrified probe is selected by using the STM.

For example, the STM selects the placement position of the STM electrified probe in a constant-current mode or a constant-height mode, and the preset voltage is applied to the STM electrified probe in a pulse mode after the placement position is obtained.

Specifically, this example provides another method for selecting a position where the graphene bubble needs to be formed and for applying the preset voltage. An STM is selected, and a suitable position for forming the graphene bubble is looked for in a normal mode (such as a constant-current mode or a constant-height mode) of the STM based on principles of the STM. After the suitable position is found, the STM is set to a pulse mode, and the preset voltage is applied to the probe of the STM, that is, the STM electrified probe, in the pulse mode, to excite the hydrogen terminated layer, thereby finally forming the graphene bubble. Different modes can be controlled and operated flexibly, and are convenient and highly applicable, so that graphene bubbles with good quality can be obtained.

As an example, the preparation method for a graphene structure having graphene bubbles further includes step 4): repeating step 3) at least once to form a plurality of graphene bubbles 104 arranged in spacing.

Specifically, step 3) can be repeated at least once according to actual requirements. That is, when one graphene bubble is formed, the probe 103 is moved to another position to prepare a next graphene bubble. By repeating this process, any quantity of graphene bubbles at any required positions and in any required shapes can be formed.

For example, in step 3), the preset voltage is set according to a size of the graphene bubble that needs to be formed; and a movement area of the probe on the graphene layer is set according to the bottom surface shape of the graphene bubble that needs to be formed.

It should be noted that, during preparation of the graphene structure having graphene bubbles according to the present invention, a probe of an AFM or an STM is utilized creatively, and a particular preset voltage is applied to the probe to excite a hydrogen terminated layer below graphene that is grown by means of CVD, so as to form a hydrogen bubble 105 enveloped by the graphene, thereby obtaining the graphene bubble. Compared with the conventional method, sizes, positions, and shapes of the graphene bubbles according to this method are highly controllable. Moreover, the method is simple in operation, and has high practical value.

As shown in FIGS. 1 to 5, the present invention further provides a graphene structure having graphene bubbles, where the graphene structure is preferably prepared by using the preparation method for a graphene structure according to the present invention, but is not limited thereto. The graphene structure comprises:

a substrate 100;

a hydrogen terminated layer 101, disposed on a top surface of the substrate 100; and a graphene layer 102, disposed on a top surface of the hydrogen terminated layer 101, where at least one graphene bubble 104 formed by a bulged part of the graphene layer 102 is formed on the graphene layer 102, and the graphene bubble 104 envelopes hydrogen that is converted from the hydrogen terminated layer 101 under excitation of a preset voltage.

Specifically, a substrate 100 is provided in this step, so as to serve as a structural foundation for the hydrogen terminated layer 101 and the graphene layer 102 formed subsequently. The material of the substrate 100 may be any one of Ge (germanium), Cu (copper), Ni (nickel), h-BN (hexagonal boron nitride) and Au (gold). Alternatively, the substrate 100 may be of a laminated structure formed by material layers made of at least two of the foregoing materials. Definitely, the substrate 100 may be made of any material that is well known to persons of ordinary skill in the art and can implement the function of this solution.

Specifically, the hydrogen terminated layer 101 provides a gas source for forming the graphene bubble 104 subsequently. In this example, the hydrogen terminated layer 101 (also referred to as a hydrogen terminated surface) is preferably a surface formed by filling unsaturated bonds on the surface of an original sample (the surface of the substrate 100) with hydrogen atoms. The hydrogen terminated layer can be approximately regarded as a layer of single-atom thin film similar to graphene or a structure similar to two-dimensional electron gas. The hydrogen terminated layer is converted into hydrogen under excitation of the preset voltage, and the hydrogen is released so that the graphene layer is bulged, thereby forming the graphene bubble. Alternatively, the hydrogen terminated layer may be a structural layer, such as a hydrogen ion layer, disposed on the surface of the substrate 100, as long as the hydrogen terminated layer can provide a gas source for forming hydrogen subsequently.

The hydrogen terminated layer 101 is preferably formed during the process of forming the graphene layer 102 by means of CVD. In addition, the graphene layer may be single-layer graphene or multi-layer graphene. Both the single-layer graphene and the multi-layer graphene can be used to obtain a suitable graphene bubble based on the solution of the present invention.

For example, the shape of the bottom surface of the graphene bubble 104 includes any one of a dot, a linear, a circular, a square, and an annular.

Specifically, the bottom surface shape of the graphene bubble prepared by using the method according to the present invention can be controlled effectively, and is determined according to a movement area of the probe 103. For example, the shape of the bottom surface of the graphene bubble may be a dot. That is, the probe does not move after placement, and excites the hydrogen terminated layer at a particular point to form a single bubble. When the electrified probe sweeps over a line, a graphene bubble with a linear bottom surface shape can be formed. Likewise, when the electrified probe sweeps over an area of a particular shape, a graphene bubble of the particular shape can be obtained. For example, when the electrified probe sweeps over a rectangular area, a graphene bubble with a rectangular bottom surface shape can be formed.

In addition, the size of the graphene bubble depends on the value of the preset voltage. The greater the absolute value of the preset voltage is, the larger the formed graphene bubble is. The preset voltage ranges from −12 V and −2 V. The absolute value of the preset voltage is controlled to be greater than 2 V, so as to better break the hydrogen bonds and reach a threshold for hydrogen bond breakage. The absolute value of the preset voltage is controlled to be less than 12 V, so as to effectively prevent a hydrogen bubble 105 from becoming excessively large, which will eventually cause the graphene bubble to break. Preferably, the preset voltage ranges from −10 V and −4 V, and in this example, the preset voltage is −5 V, so that a graphene bubble with good quality can be obtained.

In conclusion, the present invention provides a graphene structure having graphene bubbles and a preparation method for the same. The preparation method comprises: providing a substrate; forming a hydrogen terminated layer on a top surface of the substrate and a graphene layer disposed on a top surface of the hydrogen terminated layer; and placing a probe on the graphene layer and applying a preset voltage to the probe, to excite a part of the hydrogen terminated layer at a position corresponding to the probe to convert into hydrogen, the hydrogen causing the graphene layer at a position corresponding to the hydrogen to bulge, so as to form a graphene bubble enveloping the hydrogen. Through the above solution, forming positions of graphene bubbles can be controlled precisely, and the sizes, the shapes, and the like of the graphene bubbles are highly controllable. The preparation method according to the present invention is simple in operation, and has high practical value.

The foregoing embodiments are only to illustrate the principle and efficacy of the present invention exemplarily, and are not to limit the present invention. Any person skilled in the art can make modifications or variations on the foregoing embodiments without departing from the spirit and scope of the present invention. Accordingly, all equivalent modifications or variations completed by persons of ordinary skill in the art without departing from the spirit and technical thinking disclosed by the present invention should fall within the scope of claims of the present invention.

What is claimed is:

1. A preparation method for a graphene structure having graphene bubbles, comprising the following steps:
    1. Providing a substrate;
    2. Forming a hydrogen terminated layer on a top surface of the substrate and a graphene layer disposed on a top surface of the hydrogen terminated layer; and
    3. Placing a probe on the graphene layer and applying a preset voltage to the probe, to excite a part of the hydrogen terminated layer at a position corresponding to the probe to convert into hydrogen, the hydrogen causing the graphene layer at a position corresponding to the hydrogen to bulge, so as to form a graphene bubble enveloping the hydrogen.

2. The preparation method for a graphene structure having graphene bubbles according to claim 1, wherein in step 2), the graphene layer is formed by chemical vapor deposition (CVD), a carrier gas used in the CVD comprises hydrogen, and in the chemical vapor process, the hydrogen saturates unsaturated bonds on the top surface of the substrate to form the hydrogen terminated layer.

3. The preparation method for a graphene structure having graphene bubbles according to claim 1, wherein in step 2), the graphene layer comprises single-layer graphene or multi-layer graphene.

4. The preparation method for a graphene structure having graphene bubbles according to claim 1, wherein in step 1), a material of the substrate comprises any one of a group consisting of Ge, Cu, Ni, h-BN and Au.

5. The preparation method for a graphene structure having graphene bubbles according to claim 1, wherein in step 3), a shape of bottom surface of the graphene bubble comprises any one of a dot, a linear, a circular, a square, and an annular.

6. The preparation method for a graphene structure having graphene bubbles according to claim 1, wherein in step 3), the probe comprises an atomic force microscope (AFM) electrified probe of an AFM, and according to a position at which the graphene bubble needs to be formed, a placement position of the AFM electrified probe on the graphene layer is selected by using the AFM.

7. The preparation method for a graphene structure having graphene bubbles according to claim 6, wherein the placement position of the AFM electrified probe on the graphene layer is selected in a contact mode of the AFM, and the preset voltage is applied to the AFM electrified probe in the contact mode.

8. The preparation method for a graphene structure having graphene bubbles according to claim 6, wherein the AFM is set to an automatic mode, to continuously prepare a plurality of graphene bubbles.

9. The preparation method for a graphene structure having graphene bubbles according to claim 1, wherein in step 3), the probe comprises a scanning tunneling microscope (STM) electrified probe of an STM, and according to a position at which the graphene bubble needs to be formed, a placement position of the STM electrified probe on the graphene layer is selected by using the STM.

10. The preparation method for a graphene structure having graphene bubbles according to claim 9, wherein the placement position of the STM electrified probe on the graphene layer is selected in a constant-current mode or a constant-height mode of the STM, and the preset voltage is applied to the STM electrified probe in a pulse mode.

11. The preparation method for a graphene structure having graphene bubbles according to claim 1, wherein in step 3), the preset voltage ranges from −12 V and −2 V.

12. The preparation method for a graphene structure having graphene bubbles as in claim 1, wherein in step 3), a pressure between the probe and the graphene layer ranges from 0 nN and 300 nN.

13. The preparation method for a graphene structure having graphene bubbles according to claim 1, further comprising step 4): repeating step 3) at least once to form a plurality of graphene bubbles arranged with spacing.

14. The preparation method for a graphene structure having graphene bubbles according to any claim 1, wherein in step 3), the preset voltage is set according to a size of the graphene bubble that needs to be formed; and a movement area of the probe on the graphene layer is set according to the bottom surface shape of the graphene bubble that needs to be formed.

15. A graphene structure having graphene bubbles, comprising:
    a substrate;
    a hydrogen terminated layer, disposed on a top surface of the substrate; and
    a graphene layer, disposed on a top surface of the hydrogen terminated layer, wherein at least one graphene bubble formed by a bulged part of the graphene layer is formed on the graphene layer, and the graphene bubble envelopes hydrogen that is converted from the hydrogen terminated layer under excitation of a preset voltage.

16. The graphene structure having graphene bubbles according to claim 15, wherein a shape of the bottom surface of the graphene bubble comprises any one of a dot, a linear, a circular, a square and an annular.

* * * * *